United States Patent
Luz et al.

(10) Patent No.: US 7,791,310 B2
(45) Date of Patent: Sep. 7, 2010

(54) VEHICLE ELECTRICAL SYSTEM INCLUDING BATTERY STATE OF CHARGE DETECTION ON THE POSITIVE TERMINAL OF THE BATTERY

(75) Inventors: Oliver Luz, Ditzingen (DE); Reinhard Rieger, Brackenheim (DE); Marcus Kneifel, Oberriexingen (DE); Holger Fink, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 454 days.

(21) Appl. No.: 10/688,533

(22) Filed: Oct. 16, 2003

(65) Prior Publication Data

US 2004/0174141 A1    Sep. 9, 2004

(30) Foreign Application Priority Data

Oct. 18, 2002   (DE) .............................. 102 48 679

(51) Int. Cl.
    H02J 7/14     (2006.01)
    H02G 3/00     (2006.01)
    H02H 7/06     (2006.01)

(52) U.S. Cl. ...................... 320/104; 320/123; 307/10.1; 361/20; 361/21

(58) Field of Classification Search ................ 320/107, 320/104, 132, 149, 123; 307/10.1, 10.6, 307/10.7, 11; 361/18, 20, 21, 52, 104
    See application file for complete search history.

(56) References Cited

U.S. PATENT DOCUMENTS

| | | | | |
|---|---|---|---|---|
| 4,965,461 A | * | 10/1990 | McRoberts et al. | ........ 307/10.8 |
| 5,191,291 A | | 3/1993 | Taylor | |
| 5,701,068 A | * | 12/1997 | Baer et al. | ................... 320/119 |
| 5,739,737 A | * | 4/1998 | Hatton | ........................ 337/206 |
| 5,747,189 A | | 5/1998 | Perkins | |
| 6,116,513 A | * | 9/2000 | Perhats, Sr. | .................. 237/2 A |
| 6,300,763 B1 | | 10/2001 | Kwok | |
| 6,320,351 B1 | * | 11/2001 | Ng et al. | ...................... 320/104 |
| 6,424,157 B1 | | 7/2002 | Gollomp et al. | |
| 6,690,140 B2 | * | 2/2004 | Larson | ........................ 320/104 |
| 2003/0107863 A1 | * | 6/2003 | Kelwaski | .................... 361/93.9 |
| 2004/0048142 A1 | * | 3/2004 | Marusak et al. | ................ 429/61 |

FOREIGN PATENT DOCUMENTS

DE     100 01 340 A1     8/2001
DE     102 08 981        9/2002

OTHER PUBLICATIONS

"Central Electrical Power Distribution Modules", Auto Technology, Apr. 2001, pp. 82-85.

* cited by examiner

*Primary Examiner*—Edward Tso
*Assistant Examiner*—Richard V Muralidar
(74) *Attorney, Agent, or Firm*—Kenyon & Kenyon LLP

(57) ABSTRACT

In a vehicle electrical system powered by a battery for supplying a plurality of loads, an integrated module is provided between the positive terminal of the battery and the loads, and the integrated module includes an arrangement for detecting a state of charge of the battery, a control unit for power management of the vehicle electrical system, and at least one supply output for supplying power to the loads.

17 Claims, 6 Drawing Sheets

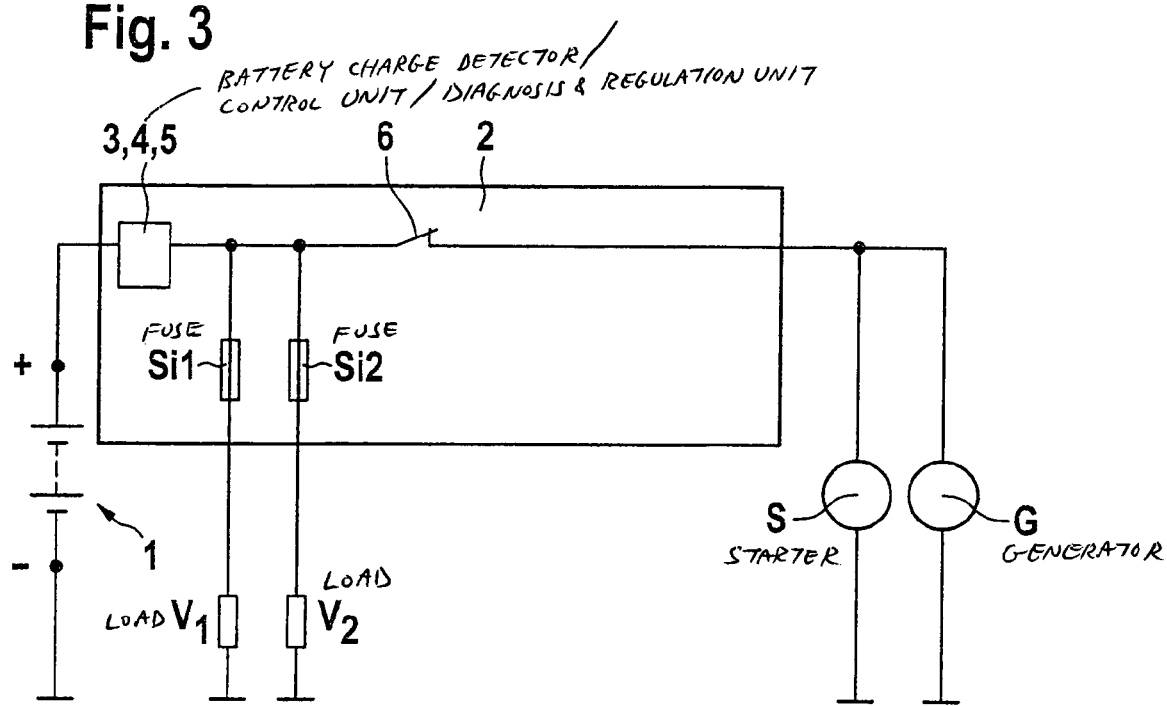
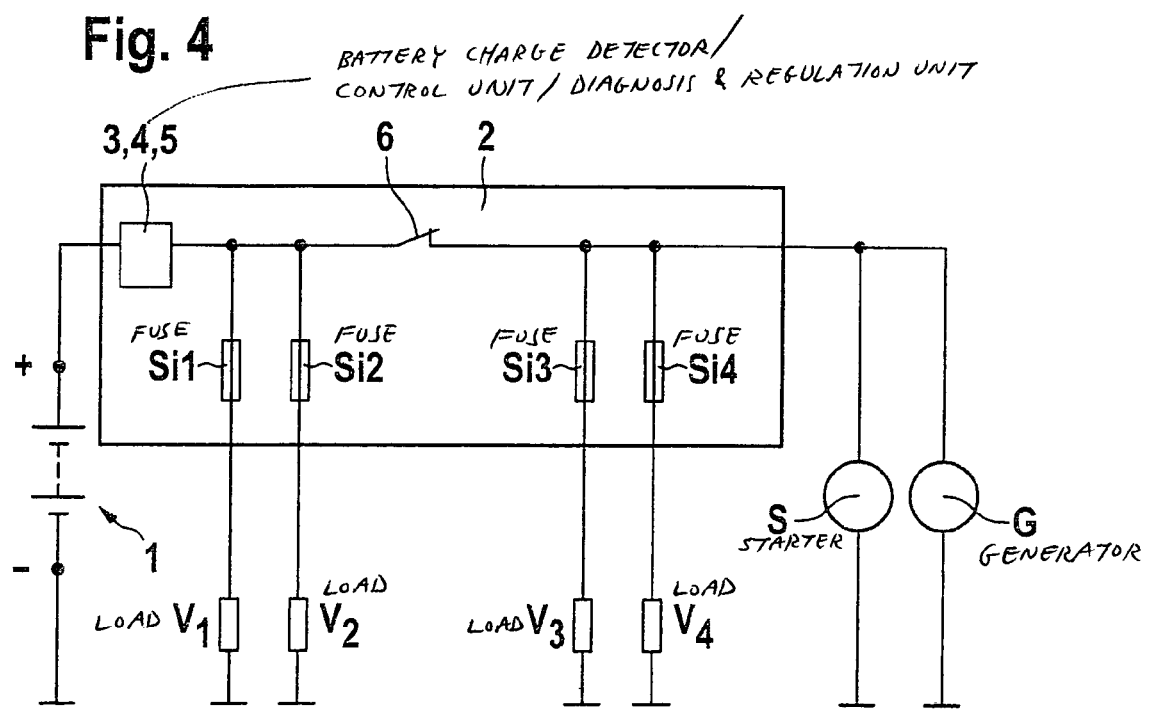

VEHICLE ELECTRICAL SYSTEM INCLUDING BATTERY STATE OF CHARGE DETECTION ON THE POSITIVE TERMINAL OF THE BATTERY

FIELD OF THE INVENTION

The present invention relates to a vehicle electrical system, and relates more particularly to a vehicle electrical system that includes an arrangement for detecting battery state-of-charge on the positive terminal of the battery.

BACKGROUND INFORMATION

A method of compensating for measuring error in detecting current in an energy storage device is known from, e.g., published German Patent Application No. 100 01 340. In the method disclosed in this document, the current is detected using two current converters that are situated on the lead running from the positive terminal of the battery to a generator and the consumers. The current converters deliver their particular output signal to an electronic evaluation unit having a correction stage. At the output of the electronic evaluation unit, corrected measured values corresponding to the battery current are supplied.

Also known in the art are back-up fuse boxes, which are connected to the positive terminal of a vehicle battery and are used for the distribution of power and fuse protection of leads and connected loads in the vehicle electrical system. Such a back-up fuse box provided in the vehicle usually contains screwable or plug-in fuses.

Control units for power management are also known in the art, which are situated between the negative terminal of the battery of a motor vehicle and ground. The battery current is detected in the area of the negative terminal. In this arrangement, a connection leading from the battery to the control unit and another connection leading from the control unit to the vehicle ground are necessary.

Furthermore, energy supply systems provided in modular form for a motor vehicle are known in the art, e.g., from the journal *Auto Technology*, April 2001, pages 82-85. Modules provided in these power supply systems contain relays, fuses and electronic components that control the current flow in the electrical supply system. These modules include, for example, back-up fuse boxes that protect the main branches of the power system, as well as fuse and relay boxes that protect downstream systems and switch loads (or groups of loads) on and off.

SUMMARY OF THE INVENTION

In accordance with the present invention, an integrated module is provided to function as a central, intelligent electrical power coordinator of a vehicle. The loads of the electrical system are supplied via this module. The direct connection of the module to the positive terminal of the vehicle battery makes it possible to use the module for detecting the battery state of charge, since the variables necessary for battery state-of-charge detection are available at the module. The negative terminal of the battery may be connected directly to ground, since the control unit provided between the negative terminal of the battery and ground in conventional systems is not present. Significant advantages result from this arrangement in accordance with the present invention in terms of cost and operation, since the resistance in the ground wire between the negative terminal of the battery and vehicle ground is not increased by additional bridging resistances that arise when a control unit is incorporated into the conventional arrangement.

In accordance with the present invention, fuses may be provided between the positive terminal of the battery and the supply leads within the module leading to the loads, the state of the fuses being monitored and considered by the control unit for electrical power management. In addition, the control unit is connected to an arrangement for detecting battery state-of-charge, thereby being able to consider the state of charge of the battery in distributing the power in the motor vehicle.

In accordance with the present invention, the control unit for electrical power management may be connected to additional control units of the motor vehicle via bus connections and to loads for the purpose of data exchange. In this manner, it is possible to include the additional control units and consumers in the electrical power management.

It is also possible to use the control unit for electrical power management to interrupt and close leads routed to specific loads (or leads routed to load groups) using a circuit breaker also situated within the module. This makes it possible, for example, to perform a closed-circuit current cutoff in a case of a fault, as well as to perform a disconnection of an entire electrical system area for servicing, transporting, or temporarily shutting down the vehicle. Furthermore, in the event of an accident, an entire electrical system area may be disconnected from the battery. This ensures that in the event of a short-circuit in the vehicle electric system caused by an accident, no cable fire will ensue. Furthermore, circuit breakers or battery master switches may be situated within the module in the path of the lead routed to the vehicle generator and in the path of the lead routed to the starter. Consequently, such components need no longer be mounted externally, which results in a cost savings.

BRIEF DESCRIPTION OF THE DRAWINGS

FIG. 3 shows a block diagram of a third exemplary embodiment of the present invention.

FIG. 4 shows a block diagram of a fourth exemplary embodiment of the present invention.

DETAILED DESCRIPTION

Figure 1:
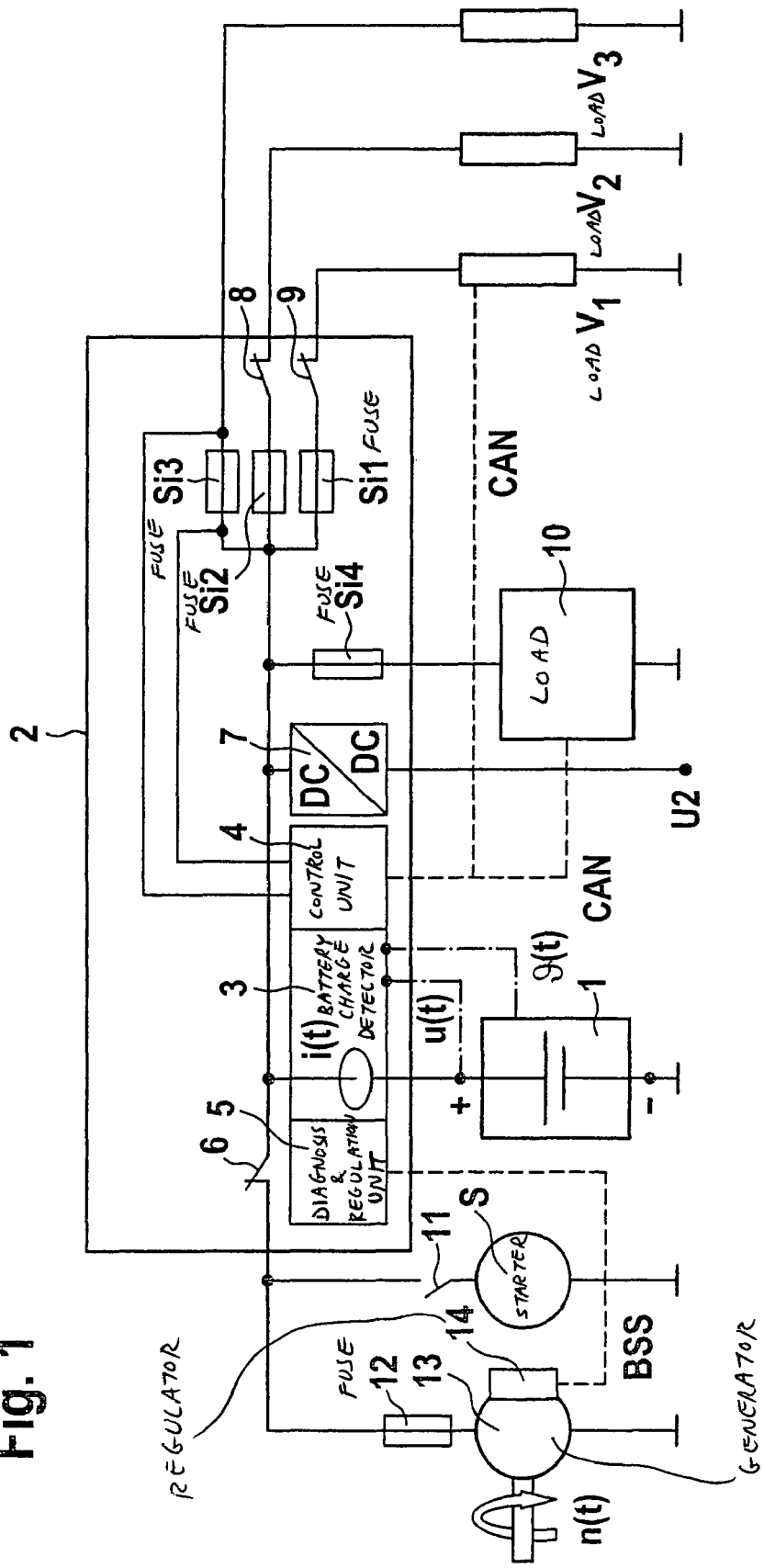
FIG. 1 shows a block diagram of a first exemplary embodiment of the present invention.

In FIG. 1, which shows a block diagram of a first exemplary embodiment of the present invention, the vehicle electrical system shown includes a battery 1 having a positive terminal and a negative terminal. The negative terminal of the battery is connected to ground. A module 2 is connected directly to the positive terminal of battery 1. This module has an integrated electronics unit, which includes means 3 for detecting the state of charge of the battery, a control unit 4 for the power management of the vehicle electrical system, a unit 5 for the diagnosis and regulation of a generator, a battery master switch 6, a DC-DC converter 7 and fuses Si1-Si4.

The fuses Si1-Si4 are each connected to a supply output of module 2, a circuit breaker 8 being provided between fuse Si2 and the associated supply output of module 2, and a circuit breaker 9 being provided between fuse Si1 and the associated supply output of module 2. Battery master switch 6 and the two circuit breakers 8 and 9 are each activated by control unit 4 for power management and opened and closed as needed during operation of the vehicle.

Loads $V_1$, $V_2$ and $V_3$ are connected to the supply outputs of module 2 assigned to fuses Si1, Si2 and Si3. An additional consumer 10, which may be an electrohydraulic brake or an electric steering system, for example, is connected to the output assigned to fuse Si4.

The terminal of battery master switch 6, which is remote from battery 1, is connected to an additional terminal of module 2, to which starter S of the motor vehicle is connected via a starter relay 11 and generator 13 of the motor vehicle is connected via an external fuse 12. Generator 13 is connected to a regulator 14 which, in turn, is in contact with unit 5 (provided within module 2) for diagnosis and regulation of the generator, via a bit synchronized interface BSS.

Means 3 for battery state-of-charge detection includes a battery current meter, a battery voltage meter and a battery temperature meter. The battery current meter measures the battery current using either Hall sensors, one or more current converters, or a current shunt. As part of this battery current measurement, the entire battery current is recorded, i.e., both the current flowing into the battery and the current flowing out of the battery. The battery voltage $u(t)$ and battery temperature $\delta(t)$ are measured using external sensors, which provide information concerning the battery voltage or the battery temperature, respectively. From the measured battery current, the measured battery voltage and the measured battery temperature, a signal describing the battery state of charge is determined, which is provided to control unit 4 for electrical power management. As an additional input signal, control unit 4 receives diagnostic signals obtained from one or more of fuses Si1, Si2, Si3 and Si4, which signals describe the state of the particular fuses.

As a function of the state signals supplied to the control unit 4, the control unit 4 performs the electrical power management of the electrical system. To this end, the control unit 4 may, for example, change the state of battery master switch 6, of circuit breaker 8, and of circuit breaker 9. If, for example, the control unit 4 detects the presence of a weak battery based on the battery state-of-charge signals, the control unit 4 then disconnects the loads whose function is not essential to the safety of the motor vehicle. The loads that are not essential for the safety of the motor vehicle include, for example, the rear window de-mister.

Furthermore, control unit 4 communicates via a vehicle bus, e.g., a CAN data bus or a LIN data bus, with other control units of the vehicle and/or individual loads, load $V_1$, for example. As part of this communication, control unit 4 is able to send information to the other components concerning the energy state of the vehicle electrical system, which the particular components implement in a suitable form, for example, to the end of reducing the energy consumption occurring there.

Control unit 4 is also connected to unit 5 for diagnosis and regulation of generator 13, and the control unit 4 is therefore also able to consider information concerning the state of the generator for electrical power management, as well as initiate a regulation of the generator, based on which the state of charge of the battery is rapidly increased again in the event of a weak battery.

Using DC-DC converter 7, which is also situated within module 2, the supply voltage derived from battery 1 is converted into another supply voltage U2, which is needed by additional consumers not shown in FIG. 1.

In accordance with the present invention, the above-described integration of electronic components into module 2, which forms a back-up fuse box, provides significant improvement of functionality over the conventional back-up fuse boxes, which means significant customer benefit. The above-described integration of electronic components for detecting the battery state of charge and for providing power management in one back-up fuse box provides a significant advantage because the back-up fuse box in accordance with the present invention is located in the vicinity of the battery, where state variables such as battery current, battery voltage and battery temperature are available. Moreover, with the integrated back-up fuse box located in the vicinity of the battery, it is possible to perform a control and diagnosis of power flow paths, fuses, circuit breakers, etc., in connection with power management.

The use of a back-up fuse box as an installation site for the above-described integrated electronic unit eliminates the necessity for an additional control unit to be installed in the vehicle. This is a great advantage with respect to costs and required space.

The present invention also addresses the fact that the selection of electrical loads in motor vehicles is constantly increasing, e.g., safety-relevant consumers such as an electrohydraulic brake or electric power-assisted steering. The described integration of a battery state-of-charge detector and power management in one back-up fuse box connected to the positive terminal of the battery makes it possible to increase the reliability of the electrical system through intelligent activation and deactivation of consumers and a control of the charge or discharge operation of the battery.

The use of a battery master switch, which is situated within the module (which forms a back-up fuse box), also makes it possible, for example, to protect a starter lead in vehicles that have a battery located in the rear.

Figure 2:
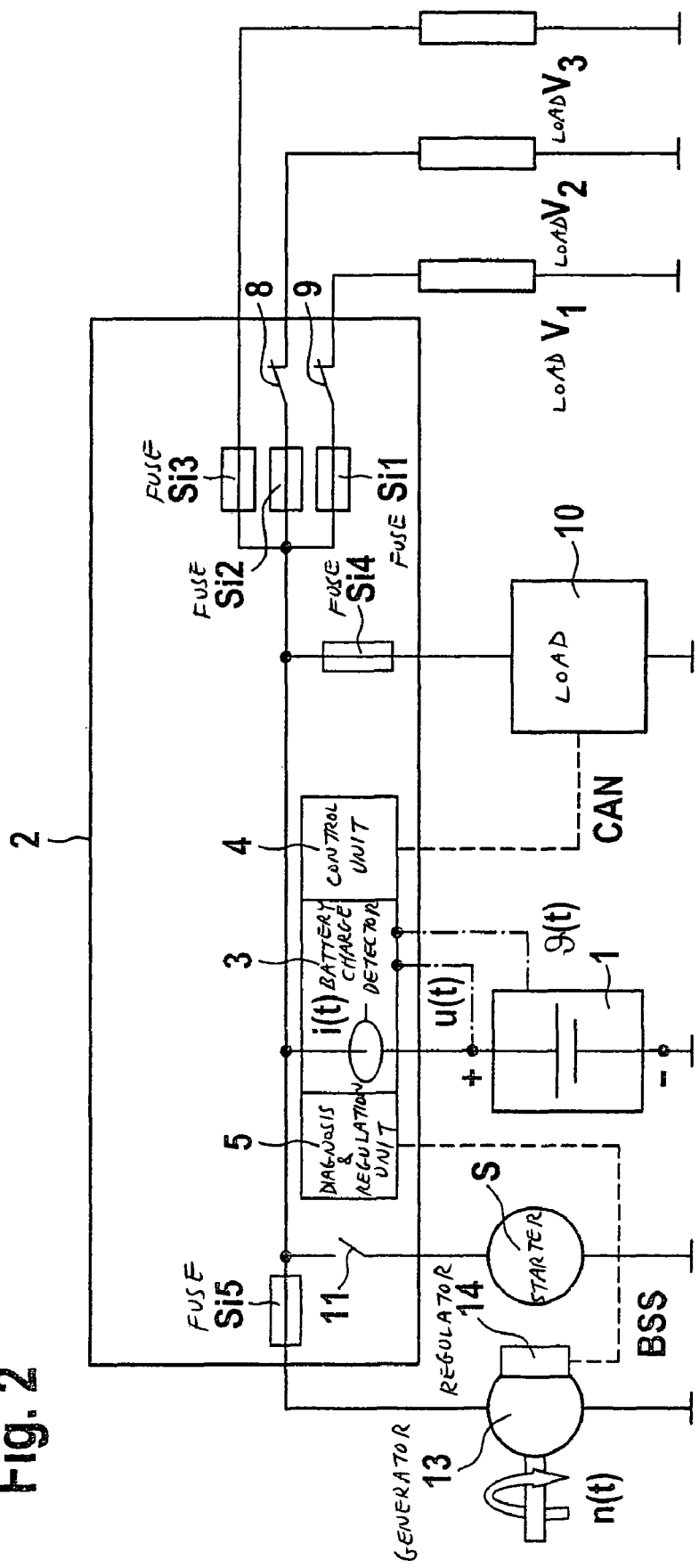
FIG. 2 shows a block diagram of a second exemplary embodiment of the present invention.

FIG. 2 shows a block diagram of a second exemplary embodiment of the invention. The vehicle electrical system shown in FIG. 2 includes a battery 1 having a positive terminal and a negative terminal; the negative terminal is connected to ground. A module 2, which is connected directly to the positive terminal of battery 1, has an integrated electronics unit, which includes means 3 for detecting the battery state of charge, a control unit 4 for the power management of the vehicle electrical system, a unit 5 for the diagnosis and regulation of a generator, a starter relay 11 and fuses Si1-Si5.

Fuses Si1-Si4 are each connected to a supply output of module 2. A circuit breaker 8 is provided between fuse Si2 and the associated supply output of module 2, and a circuit breaker 9 is provided between fuse Si1 and the associated supply output of module 2. The two circuit breakers 8 and 9, as well as starter relay 11, are each activated by control unit 4 for power management and opened and closed as needed during operation of the vehicle.

Loads $V_1$, $V_2$ and $V_3$ are connected to the supply outputs of module 2 assigned to fuses Si1, Si2 and Si3. An additional load 10, which may be an electrohydraulic brake or an electric steering system, is connected to the output assigned to fuse Si4.

The terminal of fuse Si5, which is remote from battery 1, is connected to an additional terminal of module 2, to which generator 13 of the motor vehicle is connected. Generator 13 is also connected to a regulator 14 which, in turn, is in contact with unit 5 for the diagnosis and regulation of the generator provided within module 2, via a bit synchronized interface BSS. The terminal of starter relay 11, which is remote from battery 1, is connected to starter S, and one terminal of the starter is connected to ground.

Means 3 for detecting the battery state of charge includes a battery current meter, a battery voltage meter and a battery temperature meter. The battery current meter measures the battery current using Hall sensors, one or more current converters, or a current shunt. As part of this battery current measurement, the entire battery current is recorded, i.e., both the current flowing into the battery and the current flowing out of the battery. The battery voltage $u(t)$ and battery temperature $\delta(t)$ are measured using external sensors, which provide information concerning the battery voltage or the battery temperature, respectively. From the measured battery current, the measured battery voltage and the measured battery temperature, a signal describing the battery state of charge is determined and provided to control unit 4 for electrical power management.

As a function of the state signals supplied to the control unit 4, the control unit 4 performs the electrical power management of the electrical system. To this end, the control unit 4 may, for example, change the state of starter relay 11, of circuit breaker 8 and of circuit breaker 9. If, for example, control unit 4 detects the presence of a weak battery based on battery state-of-charge signals, it then disconnects the loads whose function is not essential to the safety of the motor vehicle, e.g., the rear window de-mister.

Furthermore, control unit 4 communicates via a vehicle bus, e.g., a CAN data bus, with other control units of the vehicle and/or with load 10, for example. As part of this communication, control unit 4 is able to send information to the other components concerning the energy state of the vehicle electrical system, and the particular components utilize the information in a suitable manner, e.g., to the end of reducing the power consumption occurring there.

Control unit 4 is also connected to unit 5 for diagnosis and regulation of generator 13. Accordingly, the control unit 4 is therefore also able to consider information concerning the state of the generator for electrical power management and also initiate a regulation of the generator, based on which the state of charge of the battery is rapidly increased in the event of a weak battery.

In the exemplary embodiment shown in FIG. 2, in contrast to the embodiment shown in FIG. 1, starter relay 11 and fuse Si5 provided between the battery and generator 13 are also situated within module 2. This results in additional advantages, e.g., a simplified activation of starter relay 11. Another advantage is that it is not necessary to install fuse Si5 and starter relay 11 as additional external components.

FIG. 3 shows a block diagram of a third exemplary embodiment of the present invention. The vehicle electrical system shown in FIG. 3 includes a battery 1 having a positive terminal and a negative terminal. The negative terminal of the battery is connected to ground, and a module 2 is connected directly to the positive terminal of battery 1. The module 2 has an integrated electronics unit, which includes means 3 for detecting battery state of charge, a control unit 4 for the power management of the vehicle electrical system, a unit 5 for the diagnosis and regulation of a generator, a circuit breaker 6 and fuses Si1 and Si2.

These fuses Si1 and Si2 are each connected to a supply output of module 2. Loads $V_1$ and $V_2$ are connected to the supply outputs of module 2 assigned to fuses Si1 and Si2. Circuit breaker 6 is activated by control unit 4 for power management and is opened and closed as needed during operation of the vehicle. The terminal of circuit breaker 6, which is remote from battery 1, is connected to an additional terminal of module 2, to which starter S and generator G of the motor vehicle are in turn connected.

Means 3 for battery state-of-charge detection, control unit 4 for electrical management, and unit 5 for diagnosis and regulation of the generator operate just as described above in connection with FIGS. 1 and 2.

A feature that should be noted in the exemplary embodiment shown in FIG. 3 is the integration of circuit breaker 6 into module 2, which is a back-up fuse box. The circuit breaker shown in FIG. 3 may be opened automatically in case of an accident, e.g., in order to avoid the occurrence of a cable fire in the event of a short-circuit.

FIG. 4 shows a block diagram of a fourth exemplary embodiment of the present invention. The vehicle electrical system shown in FIG. 4 includes a battery 1 having a positive terminal and a negative terminal. The negative terminal of the battery is connected to ground, and a module 2 is connected directly to the positive terminal of battery 1. The module 2 has an integrated electronics unit, which includes means 3 for battery state-of-charge detection, a control unit 4 for the power management of the vehicle electrical system, a unit 5 for the diagnosis and regulation of a generator, a circuit breaker 6 and fuses Si1-Si4.

Fuses Si1-Si4 are each connected to a supply output of module 2. Circuit breaker 6, which is activated by control unit 4 for power management and is opened and closed as needed during operation of the vehicle, is situated between a first set of fuses Si1, Si2 and a second set of fuses Si3, Si4 in such a way that fuses Si1 and Si2 are also connected to the battery when the circuit breaker is open, while fuses Si3 and Si4 are disconnected from the battery when circuit breaker 6 is open.

Loads $V_1$ and $V_2$ are connected to the supply outputs of module 2 assigned to fuses Si1 and Si2. Loads $V_3$ and $V_4$ are connected to the supply outputs of module 2 assigned to fuses Si3 and Si4. Consequently, loads $V_3$ and $V_4$ are disconnected from the battery when circuit breaker 6 is open, while loads $V_1$ and $V_2$ continue to be supplied with power.

The terminal of circuit breaker 6 which is remote from battery 1, continues to be connected to an additional terminal of module 2, to which starter S of the motor vehicle and generator G of the motor vehicle are connected.

Means 3 for battery state-of-charge detection, control unit 4 for electrical management, and unit 5 for diagnosis and regulation of the generator operate as described above in connection with FIGS. 1 and 2.

A feature of this exemplary embodiment that should be noted is the integration of circuit breaker 6 into module 2, which is a back-up fuse box. The circuit breaker shown in FIG. 4 may be opened automatically in case of an accident, e.g., in order to avoid the occurrence of a cable fire in the event of a short-circuit. Moreover, in the event of a fault, or for transport or service, the circuit breaker may also be opened for closed-circuit current cutoff. In addition, since the circuit breaker is located between the battery and the starter, as well as between the battery and the generator, the circuit breaker carries the starter current and may also be used for protection of the otherwise unprotected starter/generator lead.

In addition to the above, positioning fuses Si1 and Si2 upstream of circuit breaker 6 ensures the power supply of loads $V_1$ and $V_2$ even when circuit breaker 6 is in open position. Loads $V_1$ and $V_2$ may be critical loads, i.e., components that must not be disconnected from the battery.

In the exemplary embodiment of FIG. 4, it is consequently possible to disconnect one group of loads from battery 1 by opening circuit breaker 6, while another group of loads continues to be supplied with power.

Figure 5:
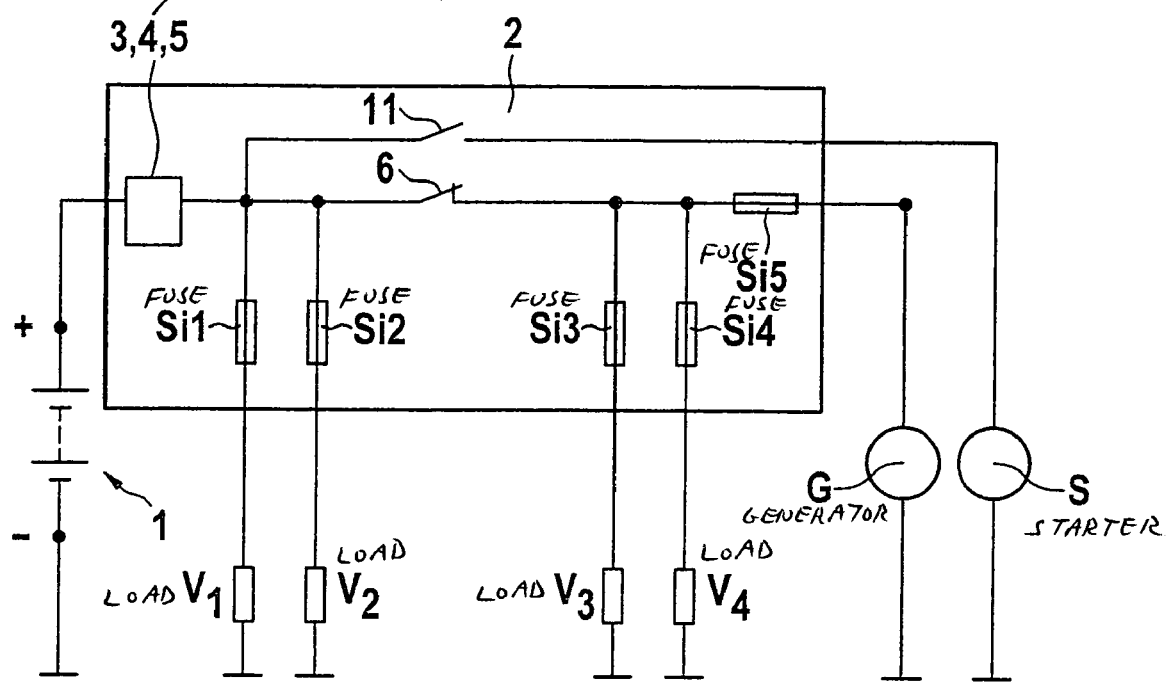
FIG. 5 shows a block diagram of a fifth exemplary embodiment of the present invention.

FIG. 5 shows a block diagram of a fifth exemplary embodiment of the present invention. The vehicle electrical supply system shown in FIG. 5 differs from the one shown in FIG. 4 in that a separate circuit breaker integrated into module 2 is assigned to starter S. In the exemplary embodiment shown in FIG. 5, generator G is connected to the battery via circuit breaker 6, with an additional fuse Si5 being provided between circuit breaker 6 and generator G. Like circuit breaker 6, this fuse Si5 is also a component of module 2.

It is possible to use circuit breaker 6 to disconnect load groups and component groups at the highest electrical system level in the event of an accident, e.g., to prevent a cable fire in the event of a short-circuit or for the purpose of a closed-circuit current cutoff in the event of a fault, or for transport or service. Circuit breaker 11 is used to switch and protect the starter lead, and circuit breaker 11 may, for example, replace the primary relay integrated in the starter and thus cut off voltage to the starter lead.

A power supply to the critical loads or the components that must not be disconnected from the battery is also ensured in this exemplary embodiment in that these loads are situated between the battery and circuit breaker 6 so that they are connected to battery 1 even when circuit breaker 6 is open.

Figure 6:
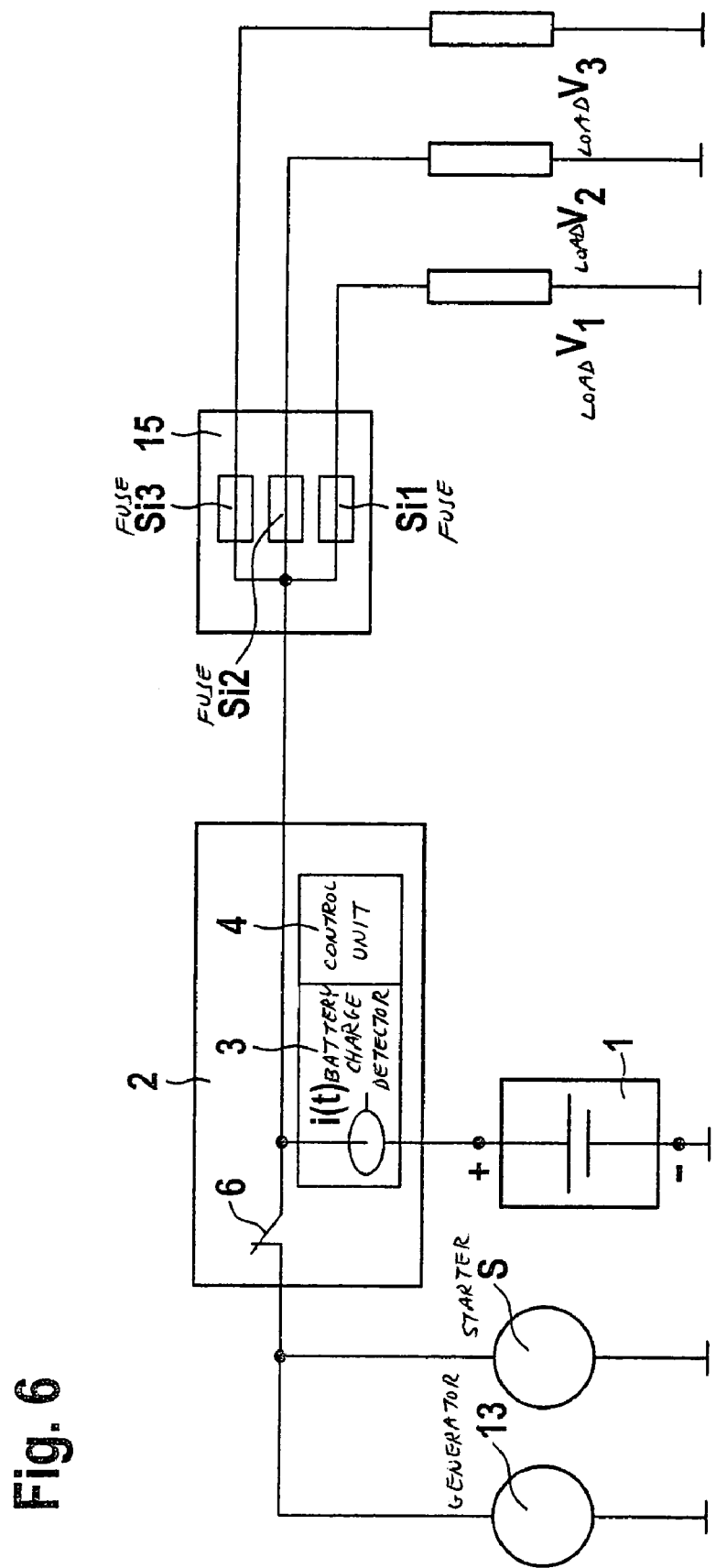
FIG. 6 shows a block diagram of a sixth exemplary embodiment of the present invention.

FIG. 6 shows a block diagram of a sixth exemplary embodiment of the present invention. This exemplary embodiment differs from the previous exemplary embodiments in that module 2 has only a single supply output to which a fuse box 15 is connected. The primary supply lead is subdivided into three load supply leads in fuse box 15, and a fuse Si1, Si2 or Si3 is situated in each of these load supply leads. Fuse box 15 has three supply outputs. Load $V_1$ is connected to the first supply output, load $V_2$ is connected to the second supply output, and load $V_3$ is connected to the third supply output.

Figure 7:
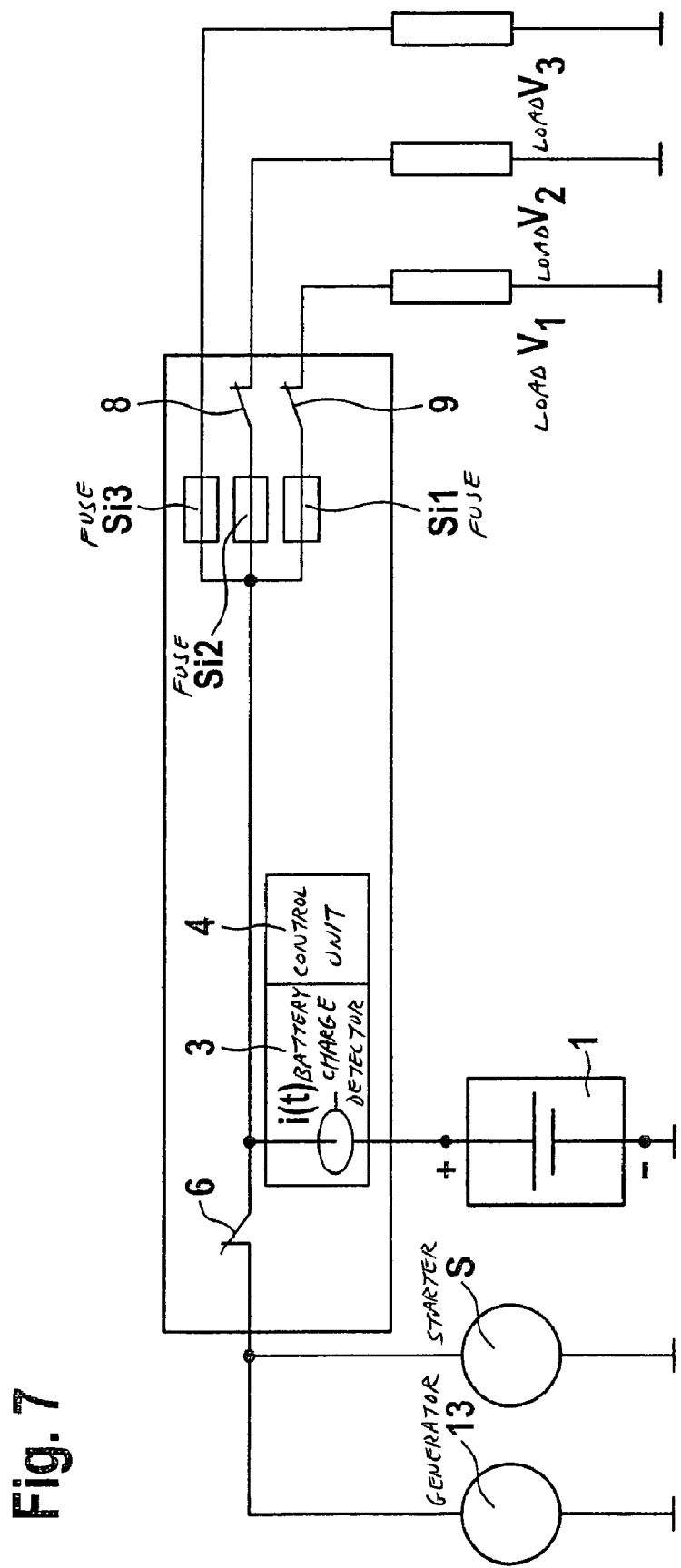
FIG. 7 shows a block diagram of a seventh exemplary embodiment of the present invention.

FIG. 7 shows a block diagram of a seventh exemplary embodiment of the present invention. This embodiment is substantially similar to the exemplary embodiment shown in FIG. 1, but differs from the embodiment of FIG. 1 in that the starter and generator leads are exclusively protected via circuit breaker 6, and in that external protection measures are omitted.

What is claimed is:

1. A vehicle electrical system powered by a battery to supply a plurality of loads, comprising:
   an integrated module positioned between a positive terminal of the battery and the plurality of loads, the integrated module having:
      an arrangement for detecting a state of charge of the battery and including a battery current measuring device, and
      a first terminal at which a generator is connectable;
   one of a battery disconnecting switch and a battery disconnecting fuse situated between the battery and the terminal;
   a control unit for power management of the vehicle electrical system;
   at least one supply output for supplying power to the loads;
   a fuse module having an input, a plurality of supply outputs, and a plurality of fuses that connect the plurality of supply outputs to the input;
   wherein a second terminal of the integrated module is connected to the input of the fuse module, and wherein the plurality of supply outputs of the fuse module provide power to the plurality of loads;
   wherein the integrated module further includes an electronics unit for regulation of the generator and diagnosis of the generator; and
   wherein the integrated module further includes a detection arrangement for diagnosis of a state of at least one of the fuses.

2. The vehicle electrical system as recited in claim 1, wherein the arrangement for detecting the state of charge of the battery includes a battery current meter.

3. The vehicle electrical system as recited in claim 1, further comprising a battery voltage sensor located outside the integrated module, wherein the arrangement for detecting the state of charge of the battery includes a battery voltage meter that cooperates with the battery voltage sensor.

4. The vehicle electrical system as recited in claim 1, further comprising:
   a switch provided within the fuse module, wherein the switch enables selective connection and disconnection between at least one of the plurality of fuses and an associated load.

5. The vehicle electrical system as recited in claim 1, further comprising:
   a plurality of fuses;
   wherein the integrated module has a plurality of supply outputs, and wherein the plurality of fuses connect the plurality of supply outputs to the battery, whereby power is provided via the plurality of supply outputs to the plurality of loads.

6. The vehicle electrical system as recited in claim 5, further comprising:
   a switch provided within the integrated module, wherein the switch enables selective connection and disconnection between at least one of the plurality of fuses and an associated load.

7. The vehicle electrical system as recited in claim 5, wherein the integrated module further includes a detection arrangement for diagnosis of a state of at least one of the fuses.

8. The vehicle electrical system as recited in claim 1, further comprising:
   a relay;
   wherein the integrated module has a terminal for connection to a starter of the vehicle, and wherein the relay is situated between the battery and the terminal of the integrated module.

9. The vehicle electrical system as recited in claim 1, further comprising:
   a communications interface for the integrated module;
   wherein the control unit for power management is in contact with at least one of the plurality of loads of the vehicle electrical system and an additional control unit of the vehicle via the communications interface for the integrated module.

10. The vehicle electrical system as recited in claim 9, wherein the communications interface is a bus interface.

11. The vehicle electrical system as recited in claim 1, wherein the integrated module further includes a DC-to-DC converter.

12. The vehicle electrical system as recited in claim 1, wherein the integrated module further includes at least one circuit breaker.

13. The vehicle electrical system as recited in claim 12, wherein the circuit breaker enables selective connection and disconnection of one of a single load and a plurality of loads from the integrated module.

14. A vehicle electrical system powered by a battery to supply a plurality of loads, comprising:
   an integrated module positioned between a positive terminal of the battery and the plurality of loads, the integrated module having:

an arrangement for detecting a state of charge of the battery and including a battery current measuring device, and
a first terminal at which a generator is connectable;
one of a battery disconnecting switch and a battery disconnecting fuse situated between the battery and the terminal;
a control unit for power management of the vehicle electrical system;
at least one supply output for supplying power to the loads;
a fuse module having an input, a plurality of supply outputs, and a plurality of fuses that connect the plurality of supply outputs to the input;
a switch provided within the fuse module, wherein the switch enables selective connection and disconnection between at least one of the plurality of fuses and an associated load;
a battery voltage sensor located outside the integrated module; and
a plurality of fuses;
wherein a second terminal of the integrated module is connected to the input of the fuse module, and wherein the plurality of supply outputs of the fuse module provide power to the plurality of loads,
wherein the integrated module further includes an electronics unit for regulation of the generator and diagnosis of the generator,
wherein the integrated module further includes a detection arrangement for diagnosis of a state of at least one of the fuses,
wherein the arrangement for detecting the state of charge of the battery includes a battery voltage meter that cooperates with the battery voltage sensor,
wherein the arrangement for detecting the state of charge of the battery includes a battery current meter,
wherein the integrated module has a plurality of supply outputs, and
wherein the plurality of fuses connect the plurality of supply outputs to the battery, whereby power is provided via the plurality of supply outputs to the plurality of loads.

15. The vehicle electrical system as recited in claim 14, wherein the integrated module further includes a detection arrangement for diagnosis of a state of at least one of the fuses, wherein the integrated module further includes a DC-to-DC converter, wherein the integrated module further includes at least one circuit breaker, and wherein the circuit breaker enables selective connection and disconnection of one of a single load and a plurality of loads from the integrated module.

16. The vehicle electrical system as recited in claim 15, further comprising:
a relay; and
a communications interface for the integrated module;
wherein the integrated module has a terminal for connection to a starter of the vehicle, and wherein the relay is situated between the battery and the terminal of the integrated module,
wherein the control unit for power management is in contact with at least one of the plurality of loads of the vehicle electrical system and an additional control unit of the vehicle via the communications interface for the integrated module, and
wherein the communications interface is a bus interface.

17. The vehicle electrical system as recited in claim 14, further comprising:
a switch provided within the integrated module, wherein the switch enables selective connection and disconnection between at least one of the plurality of fuses and an associated load.

* * * * *